(12) United States Patent
Lien

(10) Patent No.: US 6,216,239 B1
(45) Date of Patent: Apr. 10, 2001

(54) TESTING METHOD AND APPARATUS FOR IDENTIFYING DISTURBED CELLS WITHIN A MEMORY CELL ARRAY

(75) Inventor: Chuen-Der Lien, Los Altos Hills, CA (US)

(73) Assignee: Integrated Device Technology, Inc., Santa Clara, CA (US)

(*) Notice: Subject to any disclaimer, the term of this patent is extended or adjusted under 35 U.S.C. 154(b) by 0 days.

(21) Appl. No.: 08/931,201

(22) Filed: Sep. 15, 1997

(51) Int. Cl.[7] .................................................. G11C 29/00
(52) U.S. Cl. ................................................................ 714/718
(58) Field of Search ..................................... 714/718, 763, 714/725; 365/201, 189.01, 191, 233

(56) References Cited

U.S. PATENT DOCUMENTS

| | | | |
|---|---|---|---|
| 4,726,021 | * | 2/1988 | Horiguchi et al. ....................... 371/38 |
| 4,956,816 | * | 9/1990 | Atsumi et al. ......................... 365/201 |
| 5,289,113 | * | 2/1994 | Meaney et al. ....................... 324/73.1 |
| 5,436,911 | * | 7/1995 | Mori ........................................ 714/718 |
| 5,440,524 | | 8/1995 | Devanney ........................ 365/230.06 |
| 5,457,696 | * | 10/1995 | Mori ..................................... 714/718 |
| 5,502,678 | * | 3/1996 | McClure ............................... 365/201 |
| 5,583,816 | * | 12/1996 | McClure ............................... 365/201 |
| 5,629,943 | * | 5/1997 | McClure ............................... 714/718 |
| 5,652,725 | * | 7/1997 | Suma et al. .......................... 365/200 |
| 5,684,809 | * | 11/1997 | Stave et al. ........................... 714/738 |
| 5,790,452 | * | 8/1998 | Lien ..................................... 365/154 |
| 5,808,960 | * | 9/1998 | McClure ............................... 365/233 |

OTHER PUBLICATIONS

Frederiksen, T.M., Intuitive IC Electronics, 2nd Ed. McGraw–Hall (1989), pp. 149, 182–184, 187–189.

\* cited by examiner

*Primary Examiner*—Albert Decady
*Assistant Examiner*—Guy Lamarre
(74) *Attorney, Agent, or Firm*—Skjerven Morrill MacPherson, LLP

(57) ABSTRACT

A method and structure for identifying disturbed memory cells within a memory cell array are provided. A test circuit consists of several cells within the memory cell array, and are coupled to the cells in the memory cell array. The test cells are also coupled to a test cell word line. During a long-write test, all word lines within the memory cell array are first deselected. The test cell word line is then selected, which causes the test cells to provide a logic high or a logic low voltage to the bit lines within the memory cell array. The voltage provided to the bit lines can be used to write test data into the memory cells or to create a write-disturb mode. The test cells can be either memory cells similar to that used in the memory cell array, or a circuit that couples a voltage source to the bit lines when activated.

22 Claims, 7 Drawing Sheets

TESTING METHOD AND APPARATUS FOR IDENTIFYING DISTURBED CELLS WITHIN A MEMORY CELL ARRAY

FIELD OF THE INVENTION

This invention relates to semiconductor memory devices. More particularly this invention relates to a random access memory (RAM) device having built-in circuitry for identifying defective memory cells.

BACKGROUND OF THE INVENTION

Dynamic random access memory (DRAM) and static random access memory (SRAM) are two kinds of random access memory devices. Each RAM device consists of an array or several arrays of memory cells. In general, each memory cell stores a data value which has a logic "1" value or a logic "0" value. Memory devices using RAM cells are compact in size and low in cost, and are widely used in electronic systems such as computers.

The reliability of each of the memory cells determines the reliability of the system. The failure of one memory cell in a multi-cell memory device can result in malfunctioning of the entire system that employs the memory device. Therefore, it is important that all memory cells in a memory device function properly.

FIG. 1 is a schematic diagram of a conventional SRAM cell 100. SRAM Cell 100 includes cross-coupled N-channel pulldown transistors 101 and 102, N-channel access transistors 103 and 104, and load resistors 105 and 106. Memory cell 100 is coupled to word line 110, data bit line BIT, and complementary bit line $\overline{BIT}$. Data bit line $\overline{BIT}$ BIT and complementary bit line form a bit line pair.

SRAM Cell 100 stores a data value which can be identified by the voltages at nodes 121 and 122. When one of nodes 121 and 122 is pulled up to a logic high voltage, the other one of nodes 121 and 122 is pulled down to a logic low voltage. Thus, e.g., a logic high voltage at node 121 and a logic low voltage at node 122 can represent a logic "1" data value.

A "write-disturb mode" is a condition where the voltages across an access transistor, such as the voltages at node 121 and node 123, are different. A write disturb mode often occurs when SRAM cell 100 stores a data value, word line 110 is deselected, and an opposite data value is written into a second SRAM cell (not shown) which shares bit lines BIT and $\overline{BIT}$ with SRAM cell 100. Thus if a logic value "1" is stored in SRAM cell 100, a write-disturb mode is created if a logic value "0" is written into the second SRAM cell.

In this condition, the voltage difference between bit line BIT and node 121 is sufficient to cause sub-threshold leakage current to flow between node 121 and bit line BIT through access transistor 103. The amount of sub-threshold leakage current which flows through transistor 103 depends on the integrity of transistor 103. A faulty transistor 103 results in a stronger leakage current between node 121 and bit line BIT. If this leakage current exceeds a certain level, the data value that is stored in SRAM cell 100 can be corrupted.

A long-write test identifies cells that exhibit an excessive leakage current in the presence of a write disturb condition such that the stored data are corrupted. A specific faulty memory cell can be identified with a long-write test. There are three steps in a long-write test. First, a known data value is written into the cells to be tested and the word lines are deselected. Second, an opposite data value is written into a cell on the same column as the cells to be tested over a long period of time to create a write-disturb mode. The "long period" is defined relative to the time required for a regular write access of the cell. A long period is normally a few microseconds in duration. Third, the tested cells are read to determine whether or not the data value stored therein has been corrupted.

Memory failure during a write-disturb is also a problem for DRAM cell arrays. FIG. 2A is a schematic diagram of a DRAM cell 200. Memory cell 200 includes access transistor 201 and storage capacitor 207. Word line 203 is coupled to the gate of access transistor 201, while bit line 205 is coupled to the source of transistor 201. DRAM cell 200 stores a data value which can be identified by the voltage at node 208. A defective access transistor 201 may cause leakage between its drain and its source, thereby causing the stored data value to be corrupted when another cell is accessed.

FIG. 2B is a schematic diagram of a dual port DRAM cell. Write transistor 211 is coupled between storage capacitor 217 and write bit line 215. The gate of write transistor 211 is coupled to write word line 216. Read transistor 212 is coupled across read word line 213 and read bit line 219. The gate of read transistor 212 is coupled to storage capacitor 217. In this configuration, a defective write transistor 211 may cause a drain-to-source leakage strong enough to disrupt the stored data value. Similarly, a defective read transistor 212 may cause a strong gate-to-drain or gate-to-source leakage to disrupt the stored data value at capacitor 217. Thus, for both the single port or multi-port DRAM cell arrays, a long-write test of the array is similarly required.

Among all memory failures, over 90% occur during write-disturb mode. Thus, it is essential that each memory device be thoroughly tested for long-write failures. FIG. 3 is a schematic diagram of a conventional SRAM device 300. SRAM device 300 shown in FIG. 3 has three word blocks, block 1, block 2, and block 3. Each word block consists of four columns, or bits, with each bit having a pair of bit lines. For example, block 1 has bit line pairs 160, 161, 162, and 163. The SRAM device is also divided into several rows, such as rows 141–150. Within a word block, memory cells in each row represent a word. For example, in word block 1, on row 141, the four cells connected to bit lines 160–163 represent one word.

Design constraints dictate that memory cells in DRAM device 300 can be accessed one word at a time. This means that a long write test on a memory cell array is normally performed on the cells word by word.

As an example, a long-write test on SRAM device 300 will begin with word block 1. A known data value, e. g., a logic "1", is provided from data bus 572 and is written into each of the cells in block 1, from row 141 to row 150. The word lines of rows 141–150 are then deselected. An opposite data value, e.g., a logic "0", is provided by data bus 572 to the bit line pairs 160–163 of word block 1 to create a write-disturb mode. The data values stored in the memory cells of word block 1 are then read to determine if a data corruption has occurred. If word block 1 sustains the long-write test, word block 2 will be tested, and a similar process is used. The memory device is considered satisfactory if each cell in each word block sustains the test. This word by word, block by block test process of the prior art is time consuming.

In order to perform a long write test more efficiently, Devanney (U.S. Pat. No. 5,440,524) proposed the use of multiple column select circuits. The method proposed by Devanney would require extra circuitry outside of the memory cell array, making the layout design of the memory device complicated.

SUMMARY

The present invention provides a method for interfacing test data with the bit lines and the word lines. According to the invention, a novel circuit for minimizing test time is located within the memory cell array and includes several test cells. The test cells are designed for test purposes only. Thus even though located in the memory cell array, the test cells are used only during the test. The test cell structure can be similar to or different from the memory cells used in the memory cell array. In some embodiments the test cells have circuitry that can connect a bit line to a voltage source. Each of the cells in the test circuit is coupled to a test cell word line. When the test cell word lines are selected, a voltage representing a particular data value is provided on every bit line of the entire memory device, thus allowing writing test data into one entire row or several entire rows of the memory cell during one clock cycle. Similarly, by activating the test cell word line, a write-disturb mode can be created on an entire row at each step.

The present invention does not require the use of a column pull-up circuit as in U.S. Pat. No. 5,440,524. The column select transistors can be either P-channel or N-channel in the present invention to allow different turn-on voltages to be used.

The dedicated row of test cells obviates the need to force bit lines to a low or a high voltage through an external data bus. Column pull up circuits can be disabled so that the bit lines are not pulled to a high voltage. During a write-disturb mode, the pull-up circuit on the bit lines are turned off. The test cells are used to couple either a logic high voltage or a logic low voltage to a complementary pair of bit lines. Thus it is unnecessary to use the data bus for pulling the bit lines to a logic high voltage or a logic low voltage.

The present invention will be more fully understood in light of the following detailed description taken together with the drawings.

DETAILED DESCRIPTION OF THE INVENTION

Figure 4:
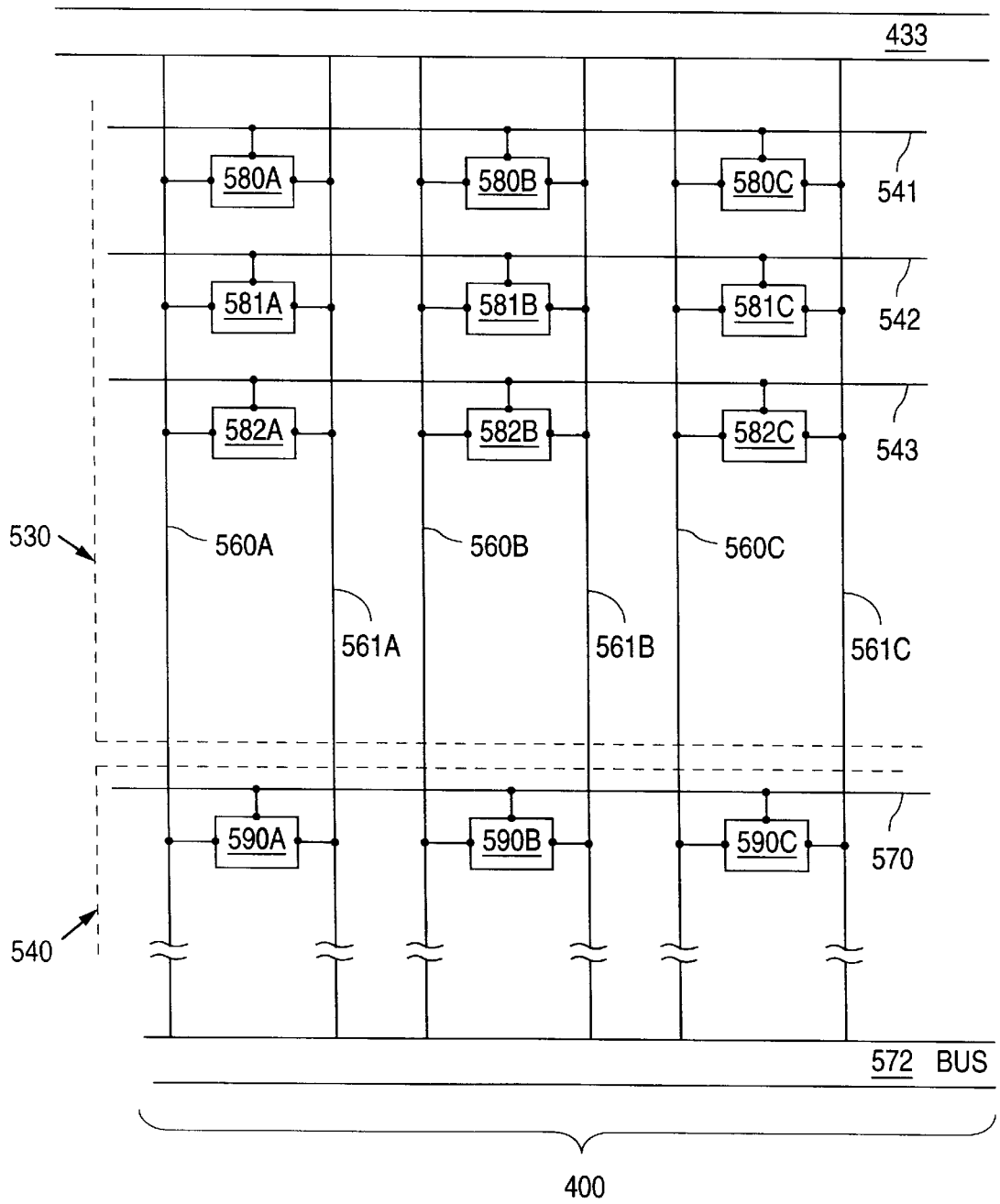
FIG. 4 is a schematic diagram of an SRAM device 300 in accordance with the present invention incorporating test cells have a structure similar to the memory cells.

FIG. 4 illustrates an SRAM device 400 incorporating a test circuit 540 in accordance with the present invention. Memory cell array 530 is so arranged that memory cells form columns as well as rows. For example, memory cells 580A, 580B, and 580C form row 1 while memory cells 580A, 581A, and 582A form column 1. Cells in each row are coupled to a common word line and cells in each column are coupled to a complementary pair of bit lines BIT and $\overline{\text{BIT}}$. For example, SRAM cells 580A, 580B, and 580C in row 1 are all coupled to word line 541, while cells 581A, 581B, and 581C in row 2 are coupled to word line 542. Cells 580A, 581A, and 582A in column 1 are coupled to a complementary pair of bit lines 560A and 561A.

A difference between the circuitry shown in FIG. 4 and that of a conventional memory device is the introduction of test circuit 540. Test circuit 540 is formed of test cells 590A, 590B, and 590C. Each of the test cells has a structure similar to the memory cells in the memory cell array 530. Each of the test cells is coupled to a column of memory cells in memory cell array 530. For example, test cell 590A is coupled to bit line 560A and complementary bit line 561A; test cell 590B is coupled to bit line 560B and complementary bit line 561B; and test cell 590C is coupled to bit line 560C and complementary bit line 561C. All test cells are connected to a test cell word line 570. Test cell word line 570 is similar in structure to the word lines 541, 542, and 543. In this embodiment, test circuit 540 is similar to a regular row of memory cells in memory cell array 530. Test circuit 540, however, is not activated during normal read and write operation of SRAM cell array 530. It is only activated during the testing phase of the chip.

Figure 1:
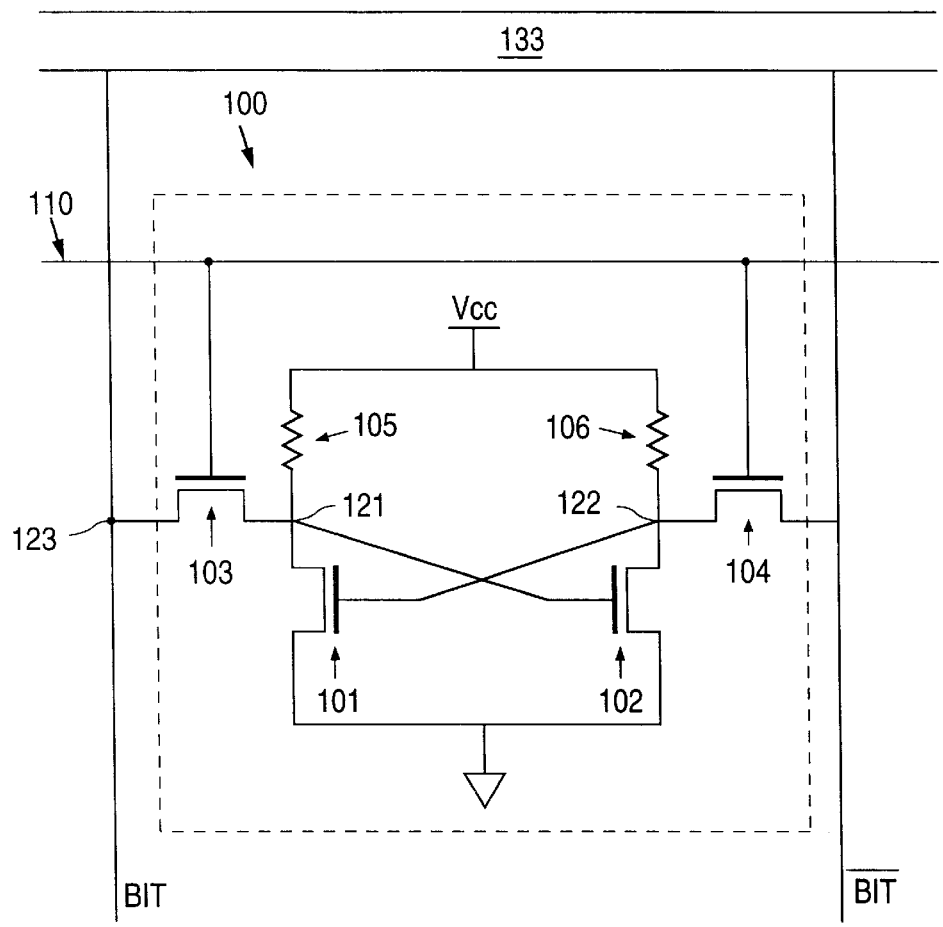
FIG. 1 is a schematic diagram of a conventional SRAM cell.

In one embodiment, the test cells in test circuit 540 are of the same type as the memory cells in memory cell array 530. In another embodiment, the test cells are made of larger pulldown transistors (corresponding to transistors 101 and 102 in FIG. 1) that provide a larger drain current than that used in the memory cells.

During a long-write test of memory cell array 530, test circuit 540 is first initialized by writing a known data value into each of the test cells in the test circuit 540. For example, a data value of "1", represented by a logic high voltage on the BIT line and a logic low voltage on $\overline{\text{BIT}}$ line, is written to each of the cells in test circuit 540. Writing is accomplished word by word. If a word is 16 bits long, in every clock cycle, 16 test cells in test circuit 540 can be written into. If the memory cell has 256 bits, 16 clock cycles are needed to write test data into every test cell in test circuit 540.

Once test circuit 540 is initialized, the data values in the test cells in test circuit 540 are copied to each SRAM cell in memory cell array 530. Since there is one test cell in correspondence with each column in memory cell array 530, the copying of test data can be accomplished row by row instead of word by word. This significantly reduces the time that is needed to test the functionality of the chip.

Copying of test data from test circuit 540 to memory 530 is accomplished as follows. During a stand-by mode, both bit lines BIT and $\overline{\text{BIT}}$ are pulled up to a logic high voltage by bit line pull-up circuit 433. Because each of the test cells 590A to 590C in test circuit 540 stores a logic "1" data value, selecting test cell word line 570 causes a logic high voltage to be asserted on data bit line BIT and a logic low voltage to be asserted on complementary bit line $\overline{\text{BIT}}$. To copy test data from test circuit 540 to row 1 of memory cell array 530, row 1 word line 541 is first selected thereby turning on access transistors in each of memory cells 580A, 580B, and 580C. Test cell word line 570 is then selected. Because a data value "1" is stored in each of the cells 590A, 590B, and 590C, a logic high voltage is provided on data bit lines 560A, 560B, and 560C, while a logic low voltage is provided on complementary bit lines 561A, 561B, and 561C.

Thus, for each memory cell in row 1 of memory cell array 530, a logic high voltage on bit line BIT and a logic low voltage on complementary bit line $\overline{\text{BIT}}$ are provided. The represented data value "1" is written into each of the cells 580A, 580B, and 580C before word line 541 is deselected.

Word line 542 of memory cell array 530 is then selected. Similarly, test data is written into each of the cells 581A, 581B, and 581C. In this way, the number of clock cycles that are needed to write test data into each of the cells in memory cell array 530 is equal to the total number of rows in memory cell array 530.

In an alternative embodiment, pulldown transistors (corresponding to transistors 101 and 102 of FIG. 1) of the test cells in test circuit 530 are the same kind as those used in the memory cells in memory cell array 540.

Once test data is written into each of the cells in memory cell array 530, the next step is to create a write-disturb mode on the memory cells. In one embodiment, data can be written into the test cells over a regular period of time, and a long write-disturb mode is subsequently created. To create a write-disturb mode in this way, all of the word lines in memory cell array 530 are deselected, while test cell word line 570 is selected. Suppose each of the memory cells stores a logic "1". A data signal of logic value zero must be written to each of the cells in test circuit 540. Because each test cell of test circuit 540 has a logic "0" data value stored in it, selecting test cell word line 570 results in a logic low voltage to be asserted on data bit line BIT in each of the columns, and a logic high voltage to be asserted on complementary bit line $\overline{\text{BIT}}$ in each of the columns. Test cell word line 570 is selected for an extended period of time, such as a few microseconds, before it is deselected. During this period of time, sub-threshold leakage in the access transistors in each of the memory cells in memory cell array 530 may cause the data value stored in the cells to be disturbed. Each of the cells is then read to determine whether the data stored therein has been disrupted.

Alternatively, a write-disturb mode can be created by imposing appropriate voltages on each of the bit line pairs using the data bus. If a data value of "1" is stored in the memory cells, voltages representing a data value "0" must be imposed on the bit line pairs. The voltages are imposed over a long period of time to test the reliability of the cells.

In the above described test, each of the cells in memory cell arrays 530 has a logic value "1" while each of the cells in test circuit 540 has a logic value of "0". It is often desirable to perform another test with logic value "0" written into each of the cells in memory cell array 530. A data signal of logic value "1" is then written into each of the cells in test circuit 540 to create a write-disturb mode. Similar to the procedure discussed above, test cell word line 570 is selected for a few microseconds. The data value in each of the cells in memory cell array 530 is then read to determine whether or not the memory cell has survived the test. If the memory cell survives the test with both logic values as described above, the memory cell is considered satisfactory.

Figure 2A:
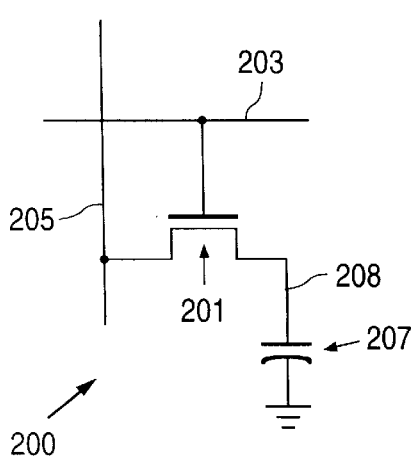
FIG. 2A is a schematic diagram of a conventional single-port DRAM cell.
Figure 2B:
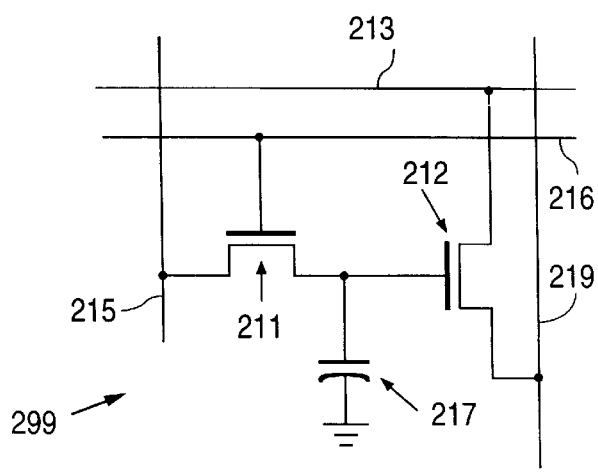
FIG. 2B is a schematic diagram of a conventional multi-port DRAM cell.
Figure 3:
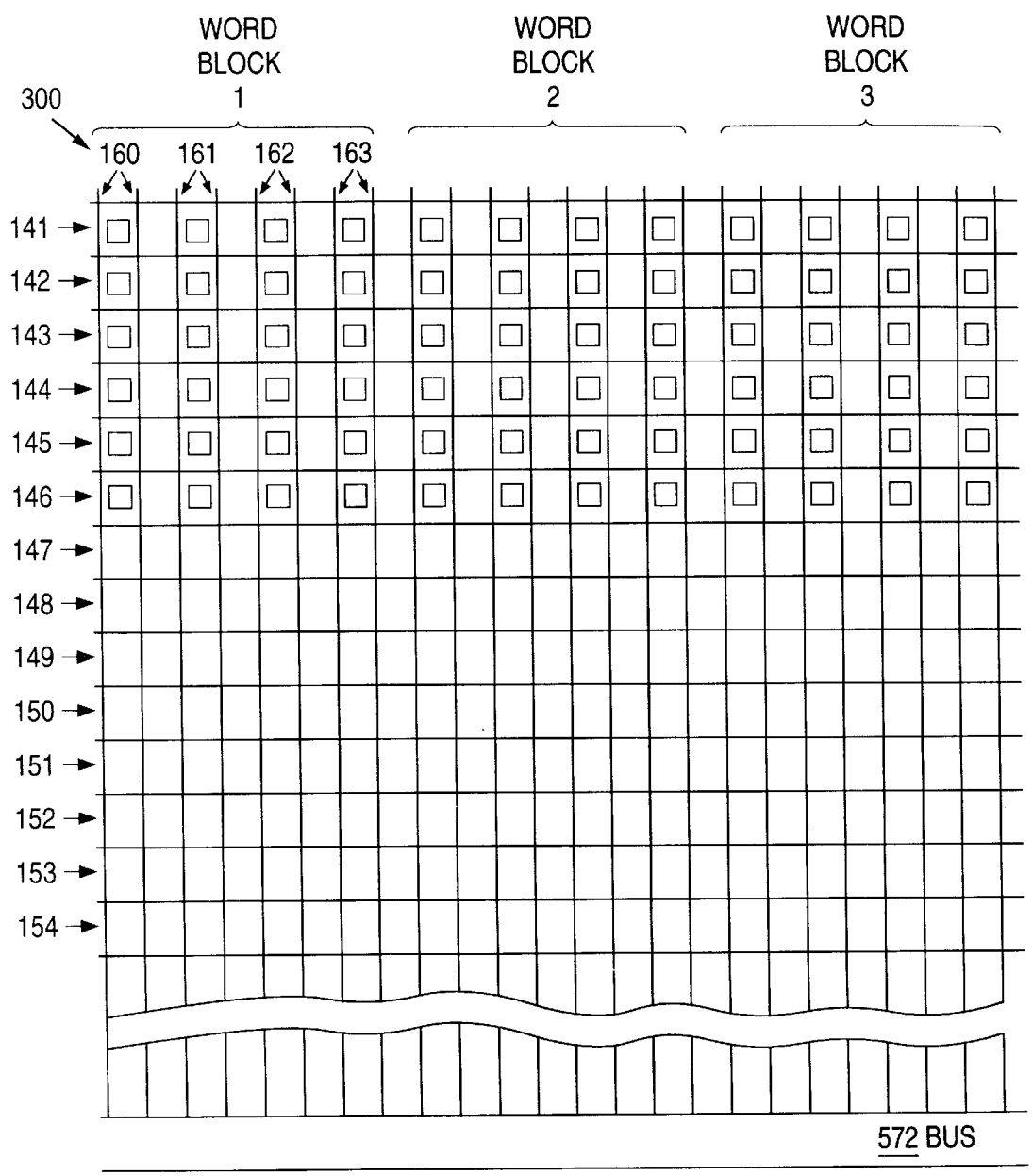
FIG. 3 is a schematic diagram of a conventional SRAM device having multiple rows and multiple columns.
Figure 5:
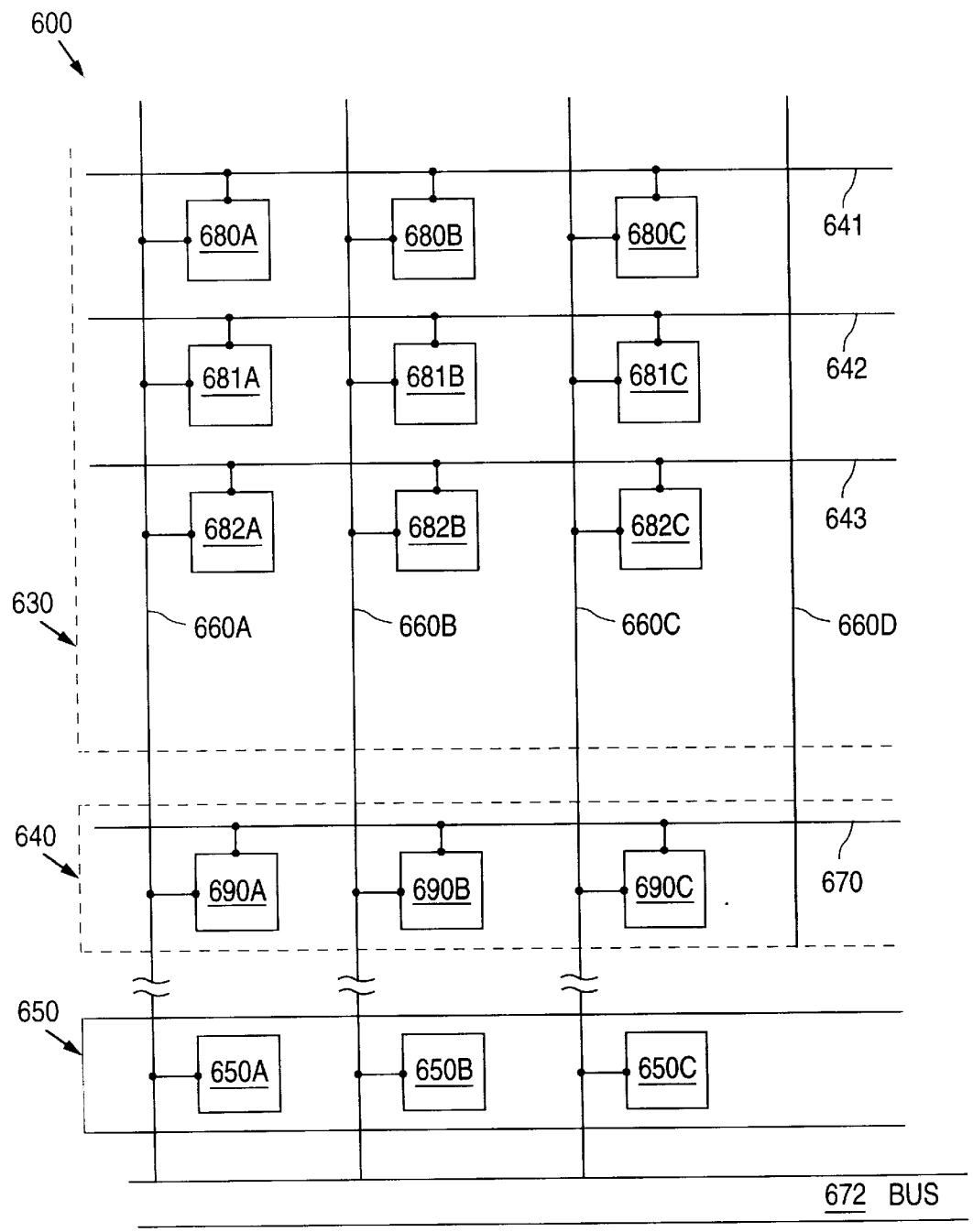
FIG. 5 is a schematic diagram of a DRAM device 400 in accordance with the present invention incorporating test cells having a structure similar to the memory cells.

The concept of the above described test circuit can also be employed in a DRAM cell array. FIG. 5 is a schematic diagram of a DRAM cell array 600 employing a test circuit in accordance with the present invention. Memory device 600 in FIG. 5 consists of a memory cell array 630, a test circuit 640, and a sense amplifier circuit 650. Memory cells in memory cell array 630 and test cell array 640 (which can be similar in structure to DRAM cell 200 in FIG. 2) are arranged into rows and columns. For example, memory cells 680A, 680B, and 680C form row 1. Memory cells 681A, 681B, 681C form row 2. Memory cells 680A, 681A, and 682A form column 1, while memory cells 680B, 681B, and 682B form column 2.

Memory cells in each row are coupled to a common word line. For example, memory cells in row 1 are coupled to word line 641. Memory cells in each column are coupled to a common bit line. For example, memory cells in column 1 are coupled to bit line 660A, while memory cells in column 2 are coupled to bit line 660B. Each of the bit lines in the memory cell array 630 is also coupled to a sense amplifier in sense amplifier circuit 650. For example, memory cells 680A, 681A, and 682A are coupled to sense amplifier 650A through bit line 660A, while memory cells 680B, 681B, and 682B are coupled to sense amplifier 650B through bit line 660B. Each of the sense amplifiers in sense amplifier circuit 650 is coupled to a bit line from memory cell array 630, and is load-balanced with a reference bit line (not shown).

In accordance with the present invention, test circuit 640 is included in memory device 600. Test circuit 640 has a structure similar to a regular row of memory cells, and each of test cells 690A, 690B, and 690C has the same or a similar structure as a memory cell such as cell 680A. Each test cell in test circuit 640 corresponds to a column in the memory cell array 630. For example, test cell 690A corresponds to column 1, test cell 690B corresponds to column 2, while test cell 690C corresponds to column 3. Each of the test cells is also coupled to a bit line. For example, test cell 690A is coupled to bit line 660A while test cell 690B is coupled to bit line 660B. A test cell word line 670 is coupled to each of the test cells. Test circuit 640 is not used during normal read or write operation of memory cell array 630.

During a normal write mode, a word line as well as a bit line must be selected in order to cause a bit of data signal to be written into a cell. In memory cell array 630, for example, to write a bit of data signal to cell 680A, word line 641 must first be selected. A data signal is provided on bit line 660A from data bus 672. The data signal on bit line 660A is written into cell 680A, and bit line 641 is then deselected.

During a read mode, word line 641 is first selected, allowing voltage stored in cell 680A to be provided on bit line 660A. Similarly, voltages stored in cells 680B and 680C are provided to bit lines 660B and 660C, respectively. The data values represented by these voltages are amplified by sense amplifier 650A and are provided to the application requesting the read operation through data bus 672.

To perform a long-write test of DRAM cell array 630, a data value, such as a logic "1", is written into each of the memory cells in test circuit 640. This data value in the test circuit is then copied to each cell in the memory cell array 630.

To copy the test data from test circuit 640 to row 1 of memory cell array 630, test cell word line 670 is selected, allowing access to test cells 690A, 690B and 690C in test circuit 640. The stored data values in cells 690A, 690B, and 690C are provided on bit lines 660A, 660B, and 660C, as well as to sense amplifiers 650A, 650B, and 650C. Each of sense amplifiers 650A, 650B, and 650C has a bi-stable latch circuit which, for a small voltage ripple on a particular bit line, returns an amplified voltage on that same bit line. Upon sensing the data signal on bit lines 660A, 660B, and 660C, sense amplifiers 650A, 650B, and 650C thus provide an amplified voltage on the same bit lines 660A, 660B, and 660C. As long as test cell word line 670 remains selected, the voltage provided on the bit lines by sense amplifiers 690A, 690B, and 690C remain the same.

While test cell word line 670 remains selected, word line 641 is selected. The data signals stored in memory cells 680A, 680B, and 680C are provided to sense amplifiers 650A, 650B, and 650C. At this time, however, the sense amplifiers have already established a voltage due to the selection of test cell word line 670. The data signals from the memory cells are weaker than the signal from the sense amplifier circuit 650. Thus the data values provided from sense amplifiers 650A, 650B, and 650C are written into the memory cells 680A, 680B, and 680C through bit lines 660A, 660B, and 660C. Word line 641 is then deselected.

To copy the test data from test circuit 640 into row 2 of memory cell array 630, a procedure similar to that described above for copying data into row 1 is used.

Selection of a word line in the structure of FIG. 5 causes the stored voltage in a memory cell to be imposed on the corresponding bit line, which in turn triggers the sense amplifier circuit to return an amplified voltage to the same bit line. Thus, in the data-copying operation, the test cell word line 670 is selected first to cause sense amplifiers 650A, 650B, and 650C to return an amplified voltage. A word line in memory cell array 630 can be selected, allowing the data value represented by the amplified voltage to be written in the memory cells. If the above procedure is reversed, i.e., a word line in memory cell array 630 is first selected, sense amplifier circuit 650 would return an amplified voltage representing the data value originally stored in the memory cells. When test cell word line 670 is subsequently selected, the amplified voltage will be supplied to test cells 690A, 690B, and 690C, destroying the originally stored test data.

Once test data have been copied into each of the cells in memory cell array 630, the word lines are deselected, and data of an opposite logic value are written into each of the test cells in test circuit 640 for creating a write-disturb mode. Thus, if each of the cells in memory cell array 630 contains a logic "1" data value, a logic "0" data value is written into each of the test cells in test circuit 640. To create a write disturb mode, test cell word line 670 is first selected, and data value is written from data bus 672 into test cells 690A, 690B, and 690C. Data can be written into the test cells over a regular period of time. All of the word lines in memory cell array 630 are deselected, thereby turning off the access transistor in each of the cells. Test cell word line 670 is selected, turning on the access transistors in each of the test cells in test circuit 640. Test cell word line 670 is selected for an extended period of time, normally a few microseconds before it is deselected.

Alternatively, a write-disturb mode can be created by imposing an appropriate voltage on each of the bit lines using the data bus. If a data value of "1" is stored in the memory cells, a voltage representing a data value "0" must be imposed on the bit lines. The voltage is imposed over a long period of time to test the reliability of the cells.

After the write-disturb mode has been completed, the data value in each of the cells in memory cell array 630 is read to determine whether or not the original data value is corrupted. If a data value read from the cell is different from the data value that was originally written into it, the memory cell is considered defective.

Figure 6:
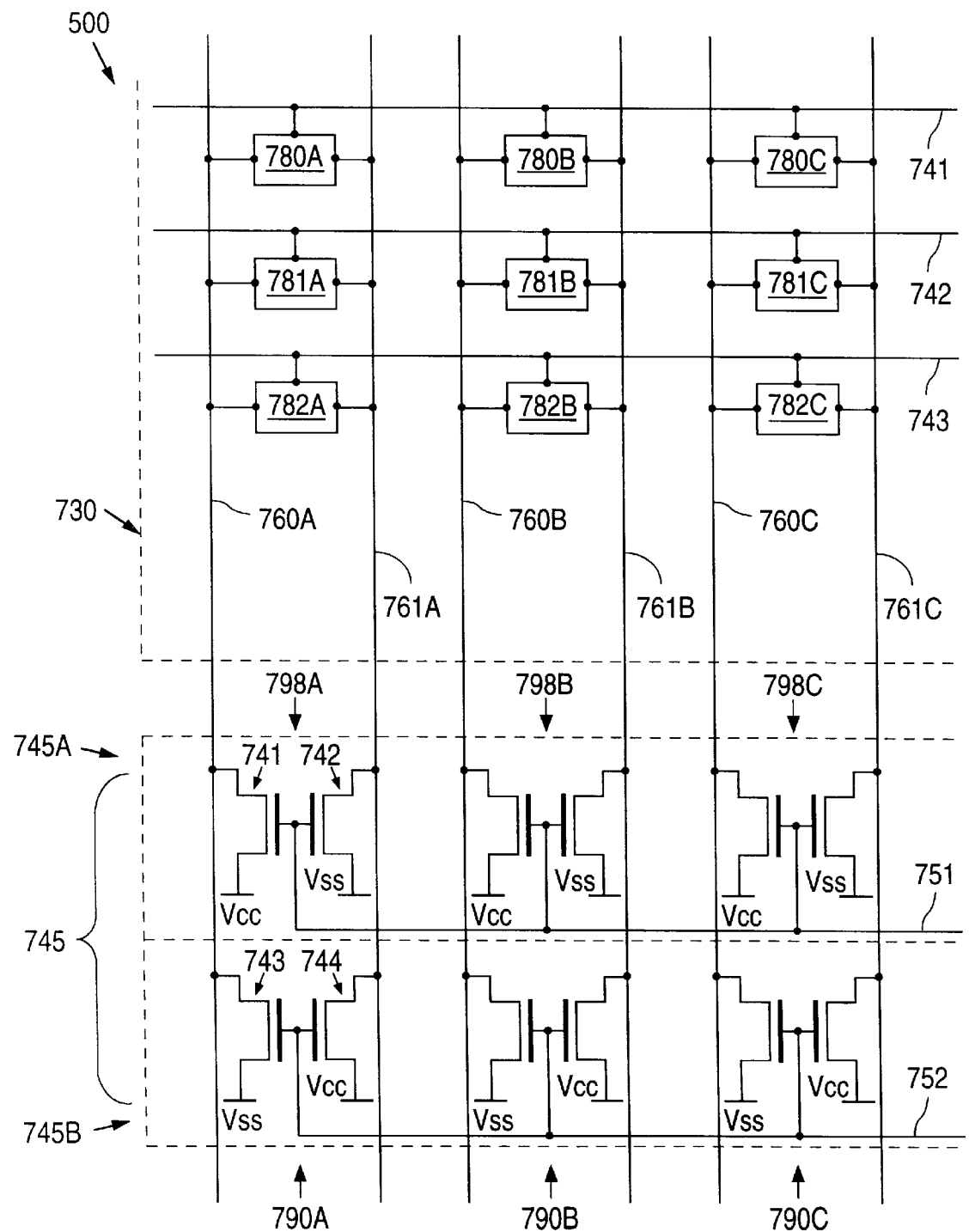
FIG. 6 is a schematic diagram of an SRAM device 500 incorporating a hard-wired test circuit in accordance with the present invention.

FIG. 6 shows another embodiment of the present invention in connection with an SRAM cell array. In FIG. 6, test circuit 745 is formed of test cells formed in rows 745A and 745B. Test cells 798A, 798B, and 798C are in row 745A, while test cells 790A, 790B, and 790C are in row 745B. Each of the test cells is formed of two N-channel transistors, such as transistors 741 and 742 in test cell 798A and transistors 743 and 744 in test cell 790A. P-channel transistors may also be used instead of N-channel transistors.

The test cells in row 745A are coupled to test cell word line 751. The test cells in row 745B are coupled to test cell word line 752. The drain of each transistor is coupled to a bit line, while the source of each transistor is coupled to a power source. For example, the drain of transistor 741 is coupled to bit line 760A, while the source of transistor 741 is coupled to logic high power source $V_{CC}$. The gates of the transistors in row 745A are coupled to test cell word line 751, while the gates of the transistors in row 745B are coupled to test cell word line 752.

When test cell word line 751 is selected, a logic high voltage $V_{CC}$ is coupled to data bit lines 760A, 760B, and 760C, while a logic low voltage $V_{SS}$ is coupled to complementary bit lines 761A, 761B, and 761C. Thus by selecting test cell word line 751, a logic value "1" is provided to each bit line pair in memory cell array 730.

In row 745B of test cells, the source of a transistor, such as transistor 743, is coupled to logic low power source $V_{SS}$ while source of another transistor, such as transistor 744, is coupled to logic high power source $V_{CC}$. Thus by selecting test cell word line 752, a logic value "0" is asserted on each bit line pair in memory cell array 730.

To write a logic value "1" into the memory cells in row 1 of memory cell array 730, test cell word line 751 is first selected, providing a logic value "1" on each of the bit line pairs. Row 1 word line 741 is then selected and deselected, writing a logic value "1" into the cells in row 1. Row 2 word line 742 is selected and deselected, writing a logic value "1" into the cells in row 2. The process is repeated until all the cells in memory cell array 730 is covered.

In FIG. 6, a long-write test does not require the step of writing test data into the test cells. The test cells in test circuit 745 are hard-wired with power sources $V_{CC}$ and $V_{SS}$, each test cell can drive more than one memory cell. Thus it is possible to write test data into more than one entire row of memory cells in memory cell array 730 during one clock cycle. Depending on the strength of power sources $V_{CC}$ and $V_{SS}$ and the test transistors 741, 742, 743, and 744, one to several hundred rows of memory cells can be written into during each clock cycle.

To create a write-disturb mode, each of the word lines in memory cell array 730 is deselected. Suppose each memory cell in memory cell array 730 stores a data value "1". Test cell word line 751 is deselected while test cell word line 752 is selected, providing a logic value "0" on each of the bit line pairs in memory cell array 730.

After the write disturb mode has been completed, the data stored in every memory cell in memory cell array 730 is read in a fashion similar to that described in connection with FIG. 4, to determine whether any of the memory cells are defective.

Figure 7:
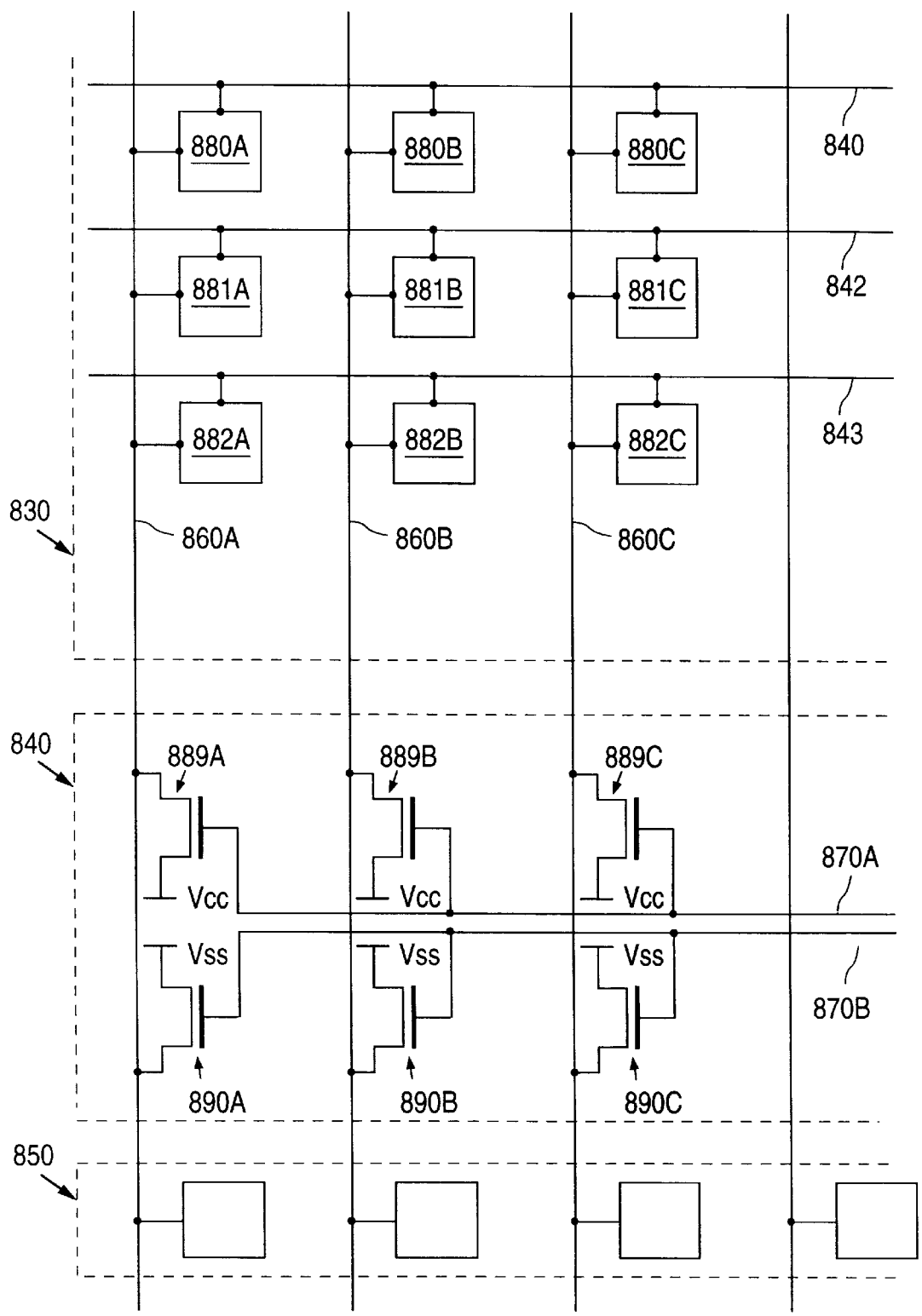
FIG. 7 is a schematic diagram of a single port DRAM device incorporating a hard-wired test circuit in accordance with the present invention.

FIG. 7 shows another embodiment of the present invention where the test cells have circuitry that hard wire the bit lines with voltage sources for performing a long write test. Memory cell array 830 has a structure similar to memory cell array 630 in FIG. 5. Therefore similar components are named similarly.

Test circuit 840 consists of two rows of test cells. Each test cell includes a transistor coupled to a voltage source. For example, the drains of transistors 889A, 889B and 889C in the first row of test cells are coupled to $V_{CC}$, while the drains of transistors 890A, 890B, and 890C in the second row are coupled to voltage source $V_{SS}$. The gates of the first row of test cells are coupled to test cell word line 870A, while the gates of the second row of test cells are coupled to test cell word line 870B. Each of the transistors corresponds to and is coupled to a bit line. For example, transistors 889A and 890A correspond to and are coupled to bit line 860A.

In the above described structure of test cells, selecting test cell word line 870A causes test transistors 889A, 889B, and 889C to turn on. Logic high power source $V_{CC}$ is coupled to bit lines 860A, 860B, and 860C across test transistors 889A, 889B, and 889C. Similarly, selecting test cell word line 870B causes logic low power source $V_{SS}$ to be coupled to bit lines 860A, 860B, and 860C.

A long-write test starts with a data value "1" stored in each of the memory cells in memory cell array 830. First, a test data signal of logic value "1" is written into every memory cell in memory cell array 830. Thus, test cell word line 870A is selected causing a logic high voltage $V_{CC}$ to be asserted on every bit line in memory cell array 830. Row 1 word line 840 is then selected and deselected causing a data value "1" to be written into every cell in row 1. Similarly, each and every word line in memory cell array 830 is selected and deselected, causing a logic value "1" to be written into every cell.

Notice that even though sense amplifier circuit 850 is connected to each bit line 860A, 860B, and 860C, it is unused during the test operation in this embodiment to write data into memory cells in memory cell array 830. Test cells in the test circuit 840 are hard-wired to either logic high power source $V_{CC}$ or logic low power source $V_{SS}$, and thus are strong enough to drive several rows of memory cells at the same time without the help of the sense amplifiers.

To create a write-disturb mode, all word lines in memory cell array 830 are deselected. Test cell word line 870B is selected while test cell word line 870A is deselected, causing a logic low voltage being asserted on every bit line in memory cell array 830.

Test cell word line 870B is then deselected. The memory cells in memory cell array 830 are read to determine whether the logic value stored in any of the memory cells has changed. If a change in logic value is detected, the cell is considered defective.

Figure 8:
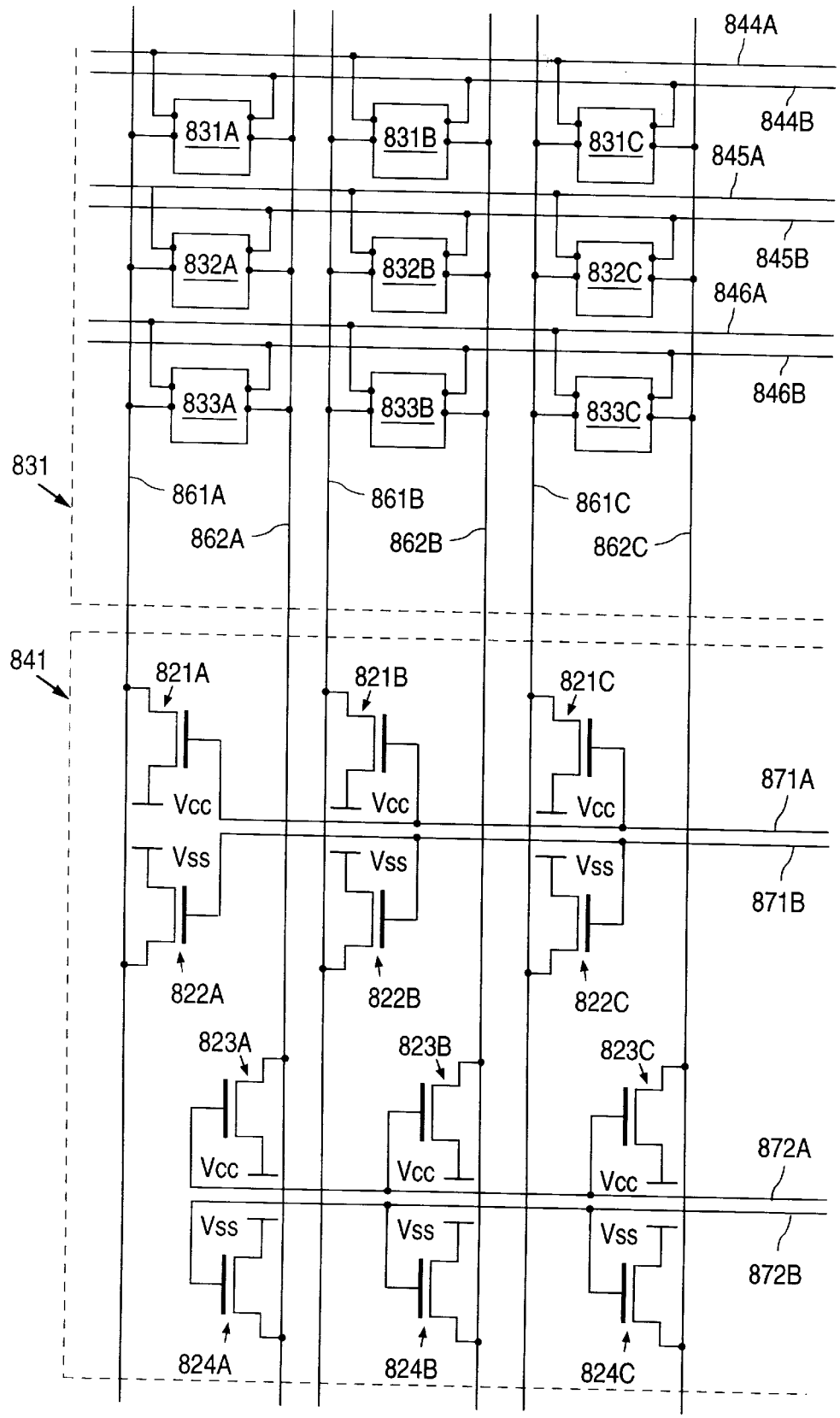
FIG. 8 is a schematic diagram of a dual port DRAM device incorporating a hard-wired test circuit in accordance with the present invention.

Although in FIG. 7 the embodiment of this invention is described in connection with a single port DRAM array, the principles of this invention can also be applied to multi-port DRAM cell arrays. FIG. 8 shows an example where the test method described above is being used for testing a dual port DRAM cell array having memory cells similar to that shown in FIG. 2B. One skilled in the art would appreciate that the principle explained in connection with FIG. 8 can be expanded to DRAM cells with more than two ports.

In FIG. 8, the memory device comprises a memory array 831 and test circuit 841. Each of the memory cells has write port accessed by a set of write word lines 844A, 845A, and 846A, and a set of write bit lines 861A, 861B, and 861C. Each of the memory cells also has a read port accessed by a set of read word lines 844B, 845B, and 846B, and a set of read bit lines 862A, 862B, and 862C. Test circuit 841 consists of four rows of test cells, each test cell including a transistor coupled to a voltage source. For example, the drains of transistors 821A, 821B, and 821C in the first row are coupled to $V_{CC}$, while the drain of the test transistors 822A, 822B, and 822C in the second row are coupled to $V_{SS}$. The source of the test transistors are coupled to a bit line. For example, the source of transistors 821A and 822A are coupled to write bit line 861A. The gates of the test cells in a row are also coupled to a test cell word line. For example, the gates of transistors 821A, 821B, and 821C are coupled to word line 871A. There are four test cell word lines, each for a row of test transistors.

In the above described structure of test cells, selecting a test cell word line couples a set of bit lines to a voltage source. For example, selecting test word line 871A causes write bit lines 861A, 861B, and 861C to be coupled with logic high voltage Vcc. The capability of the test word lines of coupling a voltage source to the bit lines can be used for long write tests in the manner explained below.

A long write test starts with a data value "1" stored in each of the memory cells in memory cell array 831. First, test cell word line 871A is selected to supply a logic high voltage to write bit lines 861A, 861B, and 861C. One or several of write word lines 844A, 845A, and 846A of the memory cell array 831 are selected to write a logic "1" data value into the memory cells. Write word lines 844A, 845A, and 846A are then deselected. The process repeats until all write word lines are selected and deselected and thus a data value "1" is written into each memory cell. The number of write word lines selected each time cycle depends on the strength of the voltage source. More write word lines can be selected for a stronger voltage source.

A write disturb mode is subsequently created. In this write disturb mode, all word lines in memory cell array 831 are deselected. Test cell word line 871B is selected to couple a logic low voltage source with write bit lines 861A, 861B, and 861C. Once the logic low voltage is imposed on the write bit lines for a long period of time, test cell word line 871B is then deselected. The memory cells in memory cell array are read to determine whether the logic value stored in any of the cells has changed. If a change in logic value is detected, the cell is considered defective.

Often it is desirable to repeat the above described test by writing a data value "0" into each memory cell. Subsequently a logic high voltage is imposed on the write word lines to create a write disturb mode. The memory cells are then read to determine if the stored logic value "0" has changed.

Test cell word lines 872A and 872B are used to test the reliability of the read port transistors of the memory cells. These tests are performed by first writing a data value, e.g., a logic high data value "1", into all the memory cells in the same manner as described above. Subsequently, test cell word line 872B is selected, coupling read bit lines 862A, 862B, and 862C to a logic low voltage source. Test cell word line 872B is then deselected. The memory cells in memory cell array 831 is then read to determine if any of the stored data values has changed. The above test can be repeated by writing a logic low data value "0" into each of the memory cells in memory cell array 831. To repeat the test, test cell word line 872A is selected to couple a logic high voltage with each of the read bit lines 862A, 862B, and 862C. The memory cells in memory cell array 831 is then read to determine if the stored data value "0" has changed.

A variation to the method described above is to select and deselect the test cell word lines 871A and 872A together to create one write disturb mode, and select and deselect test cell word lines 871B and 872B together to create another write disturb mode. Using this method both the write ports and the read ports are tested at the same time.

An alternative to the structure shown in FIG. 8 combines test cell word lines 871A and 872A into one test cell word line, and combines test cell word lines 871B and 872B into another test cell word line. Using this alternative, both the write port and the read port are tested during one write disturb mode. A disadvantage of this variation is that when a particular cell fails the test, it is hard to know whether the read port or the write port has failed.

In each of the above described embodiments, where not explicitly said, it is often desirable to test the memory cells with alternative logic values. For example, if a long-write test is performed with a logic value "1" stored in the memory cells, it is often desirable to perform another test with a logic value "0" stored in the memory cells. If a memory cell fails one of the two tests, the memory cell is considered defective. Where not explicitly said, a write disturb mode is created over a long period of time.

In each of the above described embodiments, it is also desirable to test the memory cells with data values alternating from column to column. For example, a data pattern of "101010 . . . " can be used for the first round of test, while data pattern "010101 . . . " can be used for the second round of test.

Although the drawings show memory devices with only a few rows and a few columns of memory cells, the advantage of this invention is more obvious in a cell array with a large number of columns and rows of memory cells. With conventional technology, a cell array with a large number of rows and columns consumes a significant amount of time during the test. With the provision of a test circuit in accordance with the present invention, a write-disturb mode can be created for the entire array at the same time. The time needed for testing a large memory cell array is thus significantly reduced.

In several of the above described embodiments of the invention, DRAM cells are used as test cells for a DRAM device, while SRAM cells are used as test cells for an SRAM device. It is understood, however, that SRAM cells can be used as test cells for a DRAM device. Similarly, DRAM cells can also be used as test cells for an SRAM device.

All transistors in the described embodiments can be either N-channel transistors or P-channel transistors. When a different kind of transistor is used than described, a different voltage may be required to turn the transistor on and off.

In the examples described in this specification, actions can often be taken in a different sequence to achieve the same described results. For example, in FIGS. 6 and 7, to write test data into a row of memory cells, it is unimportant whether the memory cell array word line or the test cell word line is selected first. As long as the selection of a word line overlaps with the selection of a test cell word line for a sufficiently long time, the test data will be written into the memory cells. The variations in the test process are considered within the scope of the invention.

Although the invention has been described in connection with several embodiments, it is understood that this invention is not limited to the embodiments disclosed, but is capable of various embodiments which would be apparent to one of ordinary skill in the art. Similarly, all drawings and examples in this specification are used for illustrative purposes only and in no way limit the scope of the invention.

I claim:

1. A memory device comprising:
   an array of memory cells comprising at least two rows and at least two columns, each of said memory cells containing at least one access transistor; and
   at least one dedicated row of test cells for a long write test of said memory cells, said test cells being for test purposes only, said test cells being coupled to said memory cells by a plurality of bit lines, said long write test being to determine whether one or more of said access transistors exhibits an excessive leakage current during a write disturb condition, each of said at least one dedicated row of test cells being coupled together by a test cell word line, whereby selecting said test cell word line causes said test cells in said at least one dedicated row of test cells to be accessed.

2. A memory device according to claim 1, wherein said memory cells comprise SRAM cells, each of said at least two columns of memory cells being coupled together by a pair of bit lines, each of said test cells being coupled to a corresponding pair of said bit lines extending from a column of said memory cells.

3. A memory device according to claim 1, wherein said memory cells comprise DRAM cells, each of said at least two columns of memory cells being coupled together by at least one bit line, each of said test cells being coupled to one of said at least one bit line extending from a column of said memory cells.

4. A memory device according to claim 1, wherein said test cells comprise DRAM cells.

5. A memory device according to claim 1, wherein said test cells comprise SRAM cells.

6. A memory device according to claim 1, wherein each of said test cells comprises a first transistor which couples said memory cells to a first voltage source.

7. A memory device according to claim 6 wherein said transistor is connected between said voltage source and a bit line.

8. A memory device according to claim 7 wherein each of said test cells comprises a second transistor connected between a second voltage source and said bit line.

9. A memory device according to claim 8 wherein a gate of each of said first transistors is connected to a first test cell word line and a gate of each of said second transistors is connected to a second test cell word line.

10. A memory device according to claim 8 wherein a gate of each of said first transistors is connected to a first test cell word line, a gate of each of said second transistors is connected to a second test cell word line, a gate of each of said third transistors is connected to a third test cell word line, and a gate of each of said fourth transistors is connected to a fourth test cell word line.

11. A memory device according to claim 7 wherein each of said test cells comprises a second transistor connected between a second voltage source and a complementary bit line.

12. A memory device according to claim 11 wherein each of said test cells comprises a third transistor connected between said second voltage source and said bit line and a fourth transistor connected between said first voltage source and said complementary bit line.

13. A memory device according to claim 12 wherein respective gates of said first and second transistors in said test cells are connected in common to a first test cell word line and respective gates of said third and fourth transistors in said test cells are connected in common to a second test cell word line.

14. A memory device according to claim 1, wherein said test cells comprise at least one transistor for each bit line, said transistor having a drain, a source and a gate, said drain of said transistor being coupled to said bit line, said source of said transistor being coupled to a voltage source, said gate of said transistor being coupled to said test cell word line, whereby selecting said test cell word line couples said voltage source to said bit line.

15. A memory device comprising:
an array of memory cells forming at least two rows and at least two columns; and
at least one dedicated row of test cells for long write test of said memory cells, said at least one dedicated row of test cells being coupled together by a test cell word line, whereby selecting said test cell word line causes said test cells in said at least one dedicated row of test cells to be accessed,
wherein said memory cells comprise SRAM cells, and said test cells comprise SRAM cells which have a larger size than said memory cells.

16. A method for testing a memory device having a plurality of memory cells forming at least two rows and at least two columns, comprising the steps of:
providing a plurality of test cells forming at least one row, said test cells being for test purposes only, each row of said test cells being coupled together by a test cell word line;
writing first data values to said test cells;
copying said first data values from said test cells to said memory cells;
deselecting said memory cells;
writing second data values to said test cells, said second data values being opposite in value from said first data values; and
selecting said test cells to create a write-disturb mode.

17. A method according to claim 16, wherein said first data values comprise logic "1".

18. A method according to claim 16, wherein said first data values comprise logic "0".

19. A method according to claim 16, wherein said first data values comprise alternating values of logic "0" and logic "1".

20. A memory device comprising:
an array of memory cells forming at least two rows and at least two columns, each of said memory cells comprising a first pulldown transistor; and
at least one dedicated row of test cells for long write test of said memory cells, each of said test cells comprising a second pulldown transistor, said test cells being coupled together by a test cell word line, whereby selecting said test cell word line causes said test cells to be accessed,
wherein said second pulldown transistor is capable of carrying a larger drain current than said first pulldown transistor.

21. A memory device according to claim 20 wherein each of said memory cells comprises an SRAM cell.

22. A memory device according to claim 20 wherein each of said test cells comprises an SRAM cell.

* * * * *